United States Patent
Tanaka et al.

(10) Patent No.: US 7,791,198 B2
(45) Date of Patent: Sep. 7, 2010

(54) SEMICONDUCTOR DEVICE INCLUDING A COUPLING REGION WHICH INCLUDES LAYERS OF ALUMINUM AND COPPER ALLOYS

(75) Inventors: Takekazu Tanaka, Kanagawa (JP); Kouhei Takahashi, Kanagawa (JP); Seiji Okabe, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/068,191

(22) Filed: Feb. 4, 2008

(65) Prior Publication Data

US 2008/0203568 A1 Aug. 28, 2008

(30) Foreign Application Priority Data

Feb. 20, 2007 (JP) ............................. 2007-038912
Dec. 27, 2007 (JP) ............................. 2007-337436

(51) Int. Cl.
*H01L 23/48* (2006.01)
(52) U.S. Cl. .............................. 257/738; 257/E23.251
(58) Field of Classification Search ................. 257/738, 257/E23.025
See application file for complete search history.

(56) References Cited

U.S. PATENT DOCUMENTS 5,229,646 A * 7/1993 Tsumura ..................... 257/782
6,350,667 B1 * 2/2002 Chen et al. .................. 438/612
2002/0099160 A1 * 7/2002 Shiping ........................ 528/10
2003/0141596 A1 * 7/2003 Nakamura et al. .......... 257/758
2006/0170114 A1 * 8/2006 Su et al. ...................... 257/784
2006/0186553 A1   8/2006 Ohta et al.
2009/0152729 A1   6/2009 Ohta et al.

FOREIGN PATENT DOCUMENTS

| CN | 1825580 A | 8/2006 |
| JP | 64-37044 | 2/1989 |
| JP | 1-187832 | 7/1989 |

OTHER PUBLICATIONS

Chinese Office Action dated Jun. 26, 2009 (with English translation).

* cited by examiner

*Primary Examiner*—Thao X Le
*Assistant Examiner*—Elias Ullah
(74) *Attorney, Agent, or Firm*—McGinn IP Law Group, PLLC

(57) ABSTRACT

An improved reliability in a region of a junction between a bonding wire and an electrode pad at higher temperature is achieved. A semiconductor device 100 includes a semiconductor chip 102, AlCu pads 107, which are provided in the semiconductor chip 102 and which contain Al as a major constituent and additionally contain copper (Cu), and CuP wires 111, which function as coupling members for connecting inner leads 117 provided outside of the semiconductor chip 102 with the semiconductor chip 102, and primarily contain Cu. The AlCu pads 107 and the CuP wires 111 are encapsulated with an encapsulating resin 115 that contains substantially no halogen.

21 Claims, 18 Drawing Sheets

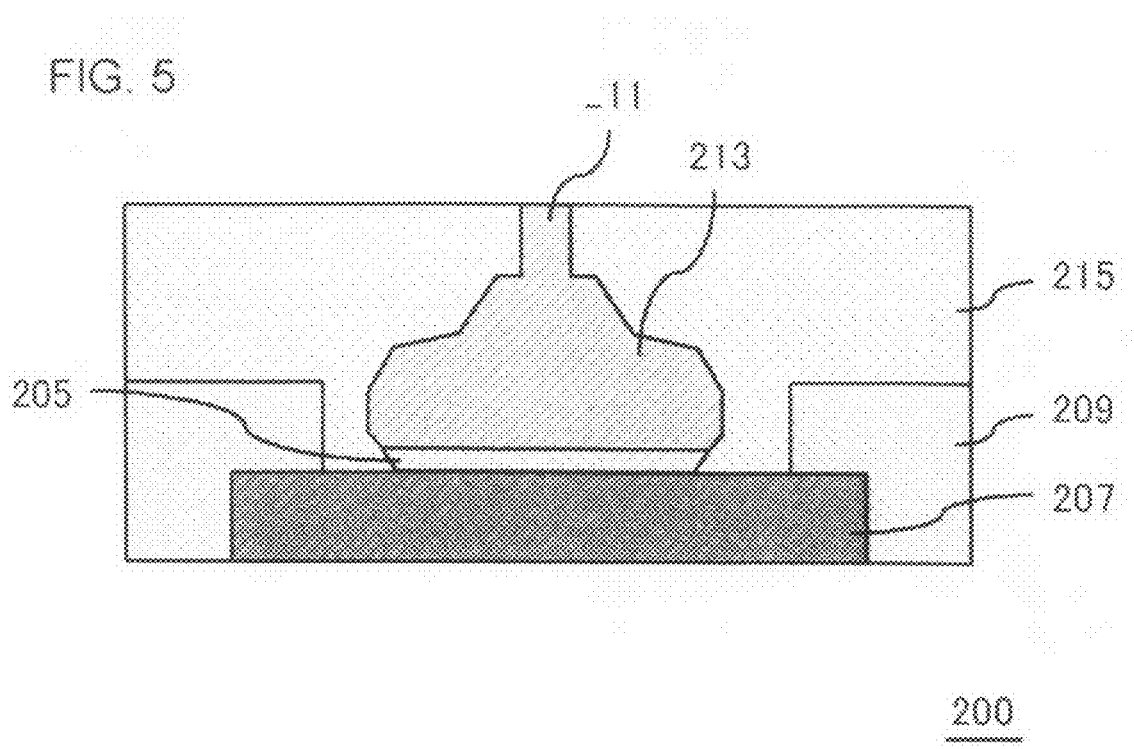

A-LAYER AlOx

B-LAYER Cu$_9$Al$_4$ or Cu$_3$Al$_2$

C-LAYER CuAl

D-LAYER CuAl$_2$

A-LAYER

AlOx

B-LAYER

Cu : ABOUT 64 at%

$Cu_9Al_4$ or $Cu_3Al_2$

C-LAYER

Cu : ABOUT 49 at%

CuAl

D-LAYER

Cu : ABOUT 35 at%

$CuAl_2$

FIG. 13

| | | PAD MATERIALS | | |
|---|---|---|---|---|
| | | SAMPLE 1 : AlSiCu | SAMPLE 2 : AlCu | SAMPLE 3 : AlSi |
| EVALUATION RESULTS | Pd-CONDITION | | | |
| | CROSS-SECTIONAL GEOMETRY | | | NO Al IS REMAINED |
| SHEAR STRENGTH | | 130~155g | 139~161g | 150~186g |
| DAMAGE UNDER PAD(G) | | 0/15 | 0/15 | 2/15 |

FIG. 16
Point1
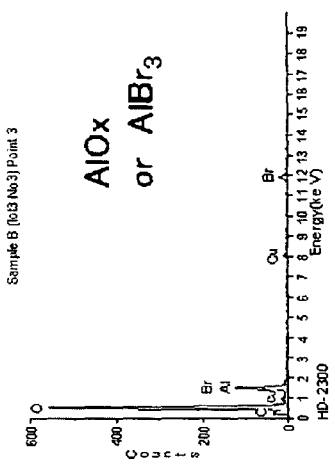
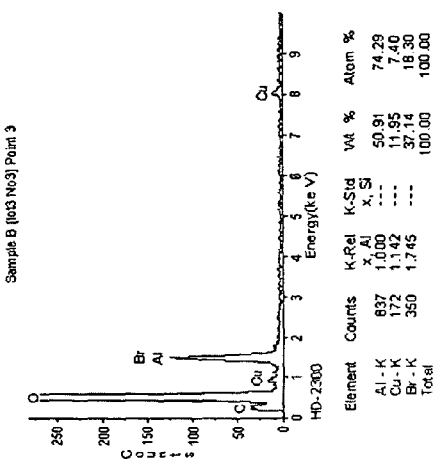
Cu 99.15%
Al 0.85%
Br 0%
Mo %
Point2
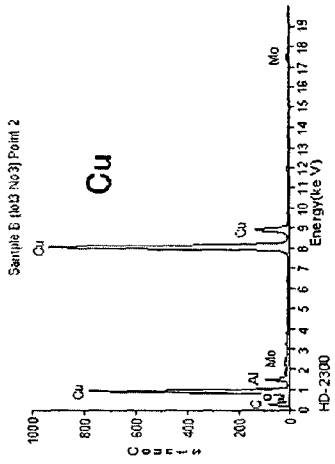
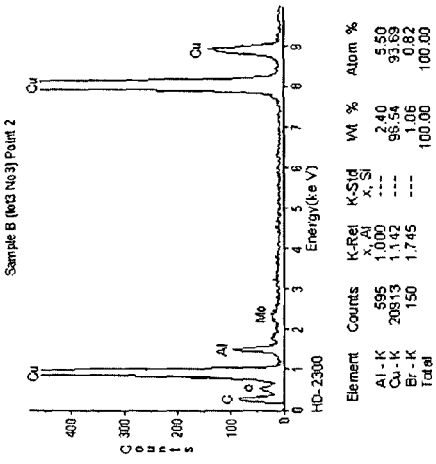
Cu 93.69%
Al 5.5%
Br 0.82%
O %
Point3
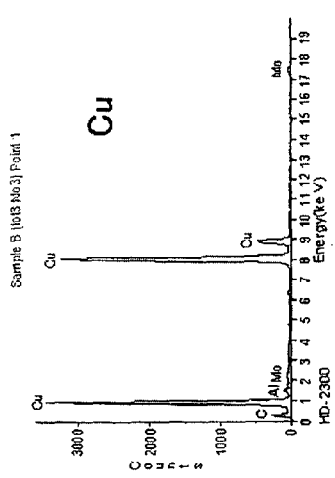
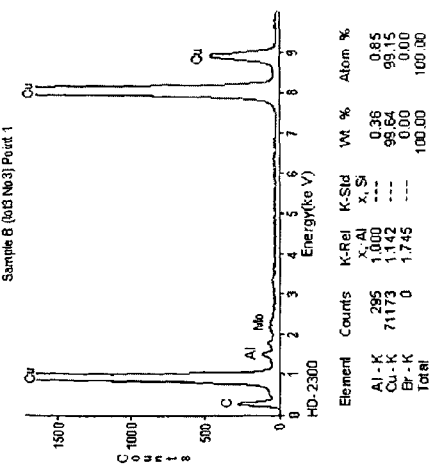
Cu 7.40%
Al 74.29%
Br 18.30%
O %

FIG. 17
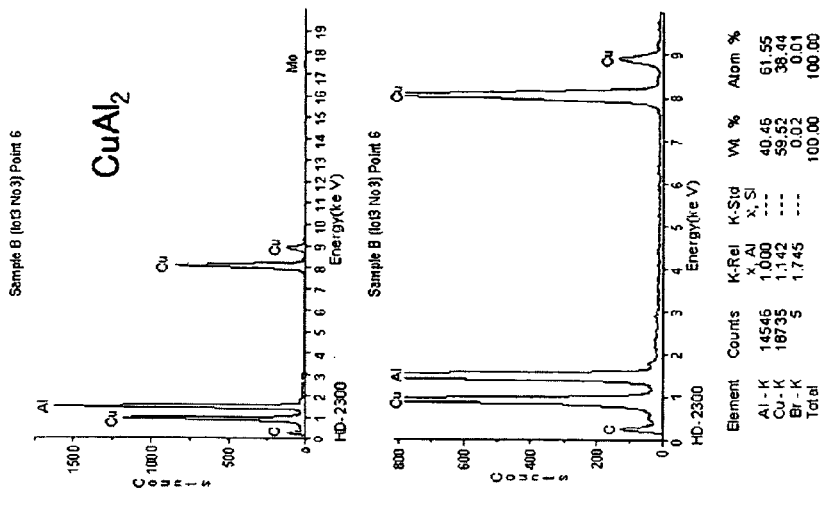
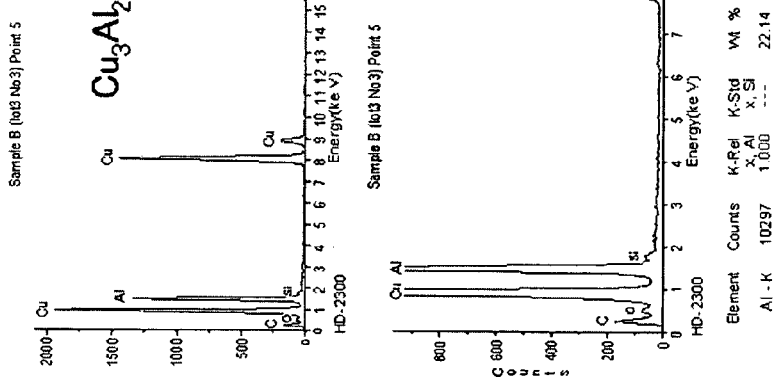
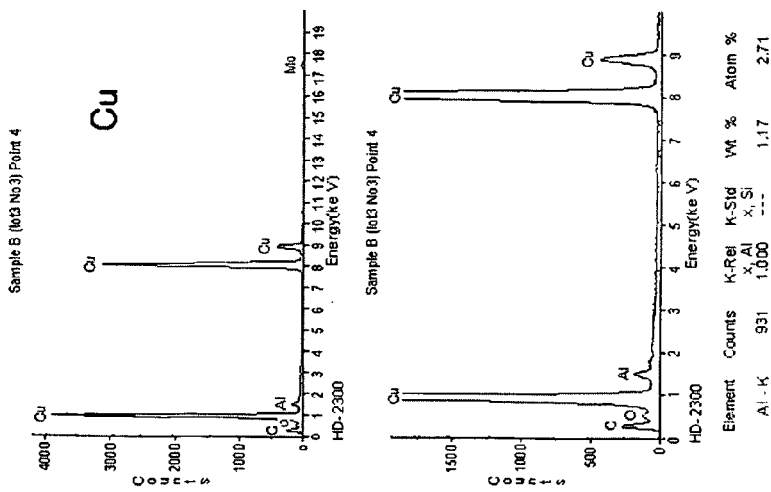

RESIN CONTAINING Br (FIRE RETARDANT AGENT)

Br-FREE RESIN

SEMICONDUCTOR DEVICE INCLUDING A COUPLING REGION WHICH INCLUDES LAYERS OF ALUMINUM AND COPPER ALLOYS

This application is based on Japanese patent applications No. 2007-38,912 and No. 2007-337,436, the contents of which are incorporated hereinto by reference.

BACKGROUND

1. Technical Field

The present invention relates to a semiconductor device, and in particular relates to a semiconductor device configured to have a junction between an electrode pad of a semiconductor chip and a coupling member of a bonding wire or the like, encapsulated with an encapsulating resin.

2. Related Art

Japanese Patent Laid-Open No. S64-37,044 (1989) and Japanese Patent Laid-Open No. H01-187,832 (1989) disclose typical semiconductor devices, which are manufactured by coupling electrode pads disposed on semiconductor chips to lead frames via coupling members such as wire bonding, and then are encapsulated with encapsulating resins.

In the semiconductor device described in Japanese Patent Laid-Open No. S64-37,044, gold (Au) wires are bonded to interconnects composed of aluminum (Al) silicon (Si) alloy.

Further, Japanese Patent Laid-Open No. S64-37,044 also discloses that a peeling-off is caused in a junction of a gold wire and an aluminum electrode pad when a plastic molded semiconductor device is kept in a higher temperature environment of 200 degree C. or higher, leading to a defective coupling, and that a similar phenomenon is also caused in a junction of a copper (Cu) wire and an aluminum electrode, in addition to the junction of the gold wire.

Further, Japanese Patent Laid-Open No. S64-37,044 additionally discloses that such phenomenon is related to level of free halogen generated in the encapsulating resin due to a thermal deterioration, and that such phenomenon can be improved by purifying a brominated epoxy resin employed as a fire retardant agent to reduce free bromine compounds generated due to a thermal decomposition.

Japanese Patent Laid-Open No. H01-187,832 discloses a bonding technology with Cu wires. Japanese Patent Laid-Open No. H01-187,832 describes that Cu is added to an electrode pad containing Al as a major constituent at relatively high ratio, for the purpose of providing an increased hardness of the electrode pad. More specifically, Cu is added to an electrode pad containing Al as a major constituent at a ratio of 2 to 12% to obtain hardness thereof at a level of 70 to 100 Vickers hardness. Japanese Patent Laid-Open No. H01-187,832 also describes that, since the hardness of such electrode pad is higher than that of the Al pad, a compressively bonded section is not peeled off during a process for bonding the Cu wire, and an impact applied to the lower layer of the electrode pad is reduced, so that damages such as cracks in the insulating film are avoided.

SUMMARY

The present inventors investigated the technologies described in Japanese Patent Laid-Open No. S64-37,044 and Japanese Patent Laid-Open No. H01-187,832, and found that there still was needs to be improved in a reliability of a junction between an electrode pad and a bonding wire during an operation at a higher temperature environment.

In such circumstances, the present inventors have conducted further investigations for achieving further improvement in an operating reliability at higher temperature for longer term. It was found from the results of the investigations that, instead of employing a configuration employing a resin composition containing bromine (Br) in at least a region in an encapsulating resin, a configuration containing substantially no Br is employed, and suitable materials are selected for an electrode pad and a coupling member such as a bonding wire, respectively, so that an improved operating reliability at higher temperature can be achieved, and hence the present invention is presented.

According to one aspect of the present invention, there is provided a semiconductor device, comprising: a semiconductor chip; an electrode pad, provided in the semiconductor chip and containing aluminum (Al) as a major constituent and additionally containing copper (Cu); and a coupling member, connecting a coupling terminal provided outside of the semiconductor chip with the semiconductor chip, and primarily containing Cu, wherein a plurality of layers of Cu and Al alloys having different content ratio of Cu and Al are provided in a region for coupling the coupling member with the electrode pad, wherein the layers of Cu and Al alloys includes a copper-aluminum alloy ($CuAl_2$) layer and a layer provided between the $CuAl_2$ layer and the coupling member and having an Al content ratio that is relatively lower than that of the $CuAl_2$ layer, and wherein the electrode pad and the coupling member are encapsulated with an encapsulating resin that contains substantially no halogen.

The semiconductor device of the present invention is configured that the coupling member primarily contains Cu, the electrode pad contains Al as a major constituent and further contains Cu, and the encapsulating resin contains substantially no halogen. Since a plurality of layers of Cu and Al alloys having different content ratio of Cu and Al are provided in a region for coupling the coupling member with the electrode pad, a generation of a defect in the region of the junction between the coupling member and the electrode pad during the operation at higher temperature is suppressed by these synergistic effects, so that the reliability can be stably improved.

Further, an improved electrical characteristic can be achieved as compared with employing Au for the material of the coupling member, and in addition, the manufacturing cost can be considerably reduced.

Any type of members may be employed for the coupling member in the present invention, as long as the member is capable of providing an electrically coupling between the coupling terminal and the semiconductor chip, and more specifically wire-shaped, ball-shaped, ribbon-shaped coupling members or the like may be employed. Irrespective of the types of the coupling member, a generation of a defect in the region of the junction between the coupling member and the electrode pad can be suppressed.

Here, the condition "the encapsulating resin contain substantially no halogen" is determined in the present Specification that halogen is not intentionally added to any of resins in the composition constituting the encapsulating resin or any of additives such as fire retardant agents and the like, and halogen, which is inevitably mixed in an encapsulating resin composition during the manufacturing process, is permitted. Even in such case of the inevitable mixture, a halogen concentration for each of halogen elements in the resin composition may be, for example, equal to or lower than 1,000 ppm, and preferably equal to or lower than 100 ppm.

Here, the condition "the electrode pad contains Al as a major constituent" is determined in the present Specification to contain Al at a rate of, for example, equal to or higher than 50% wt. over the whole electrode pad.

In addition, the condition "the coupling member primarily contains Cu" is determined in the present Specification to contain Cu at a rate of, for example, equal to or higher than 50% wt. over the whole coupling member.

As described above, according to the present invention, an improved reliability in a region of the junction between the coupling member and the electrode pad at higher temperature can be achieved.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5 is a cross-sectional view, illustrating a configuration of a semiconductor device in an embodiment;

FIG. 13 includes cross-sectional views, showing junction structures between the electrode pad and the wire in Example;

FIG. 16 includes spectrums, showing analysis results for junction layers between the electrode pad and the wire in Example;

FIG. 17 includes spectrums, showing analysis results for junction layers between the electrode pad and the wire in Example;

DETAILED DESCRIPTION

Figure 1:
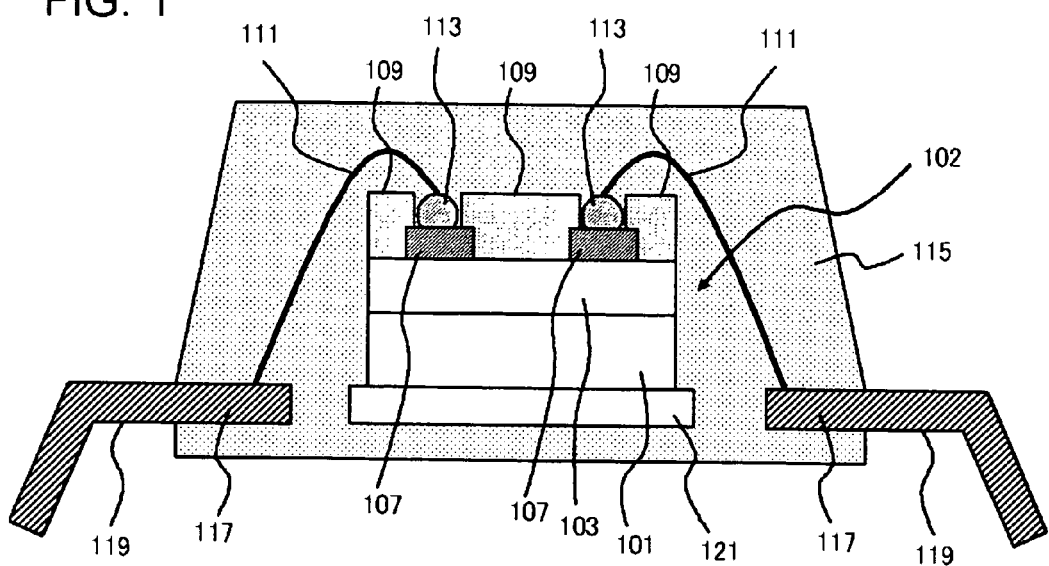
FIG. 1 is a cross-sectional view, illustrating a configuration of a semiconductor device in an embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations according to the present invention will be described in reference to the annexed figures. In all figures, an identical numeral is assigned to an element commonly appeared in the figures, and the detailed description thereof will not be repeated. Exemplary implementations employing bonding wires as coupling members for electrically coupling bonding pads with semiconductor chips will be described as follows.

First of all, for the purpose of better understanding of the present invention, a mechanism of failures occurred in a conventional semiconductor device during an operation at higher temperature as described above for the description of the summary will be described in detail.

FIG. 5 is a cross-sectional view, illustrating a configuration of a semiconductor device employed for investigations. A semiconductor device 200 shown in FIG. 5 is configured to have a multiple-layered film (not shown) composed of interconnect layers and insulating interlayers stacked on a silicon substrate (not shown). An aluminum (Al) pad 207 is provided in a certain position on a multiple-layered film (not shown), and a polyimide film 209 covers an entire side surface of, and and a portion of an upper surface of the Al pad 207. In the portion, which is not covered with the polyimide film 209, a Cu wire 211 is coupled to the upper surface of the Al pad 207. A forefront of the Cu wire 211, which is a coupling portion with the Al pad 207, is formed to be a Cu ball 213, where the Al pad 207 is joined to the Cu ball 213. An encapsulating resin 215 composed of a resin composition containing brominated epoxy resin is provided over the entire upper surface of the polyimide film 209 to cover the junction between the Al pad 207 and the Cu ball 213.

Reasons for occurring defectives in the junction during the storage at higher temperature were investigated for the semiconductor device 200 shown in FIG. 5. More specifically, a plurality of semiconductor devices 200 were manufactured, and were kept at a temperature of 175 degree C. for 2,350 hours. Then, the semiconductor devices 200 were cooled to an ambient temperature, and then the junctions between the Al pads 207 and the Cu balls 213 were observed with a scanning electron microscope (SEM). For comparison, some of the semiconductor devices 200 were taken out before completing the 2,350 hour-storage and were cooled to an ambient temperature, and then the conditions of the junctions thereof were observed.

Figure 6A:
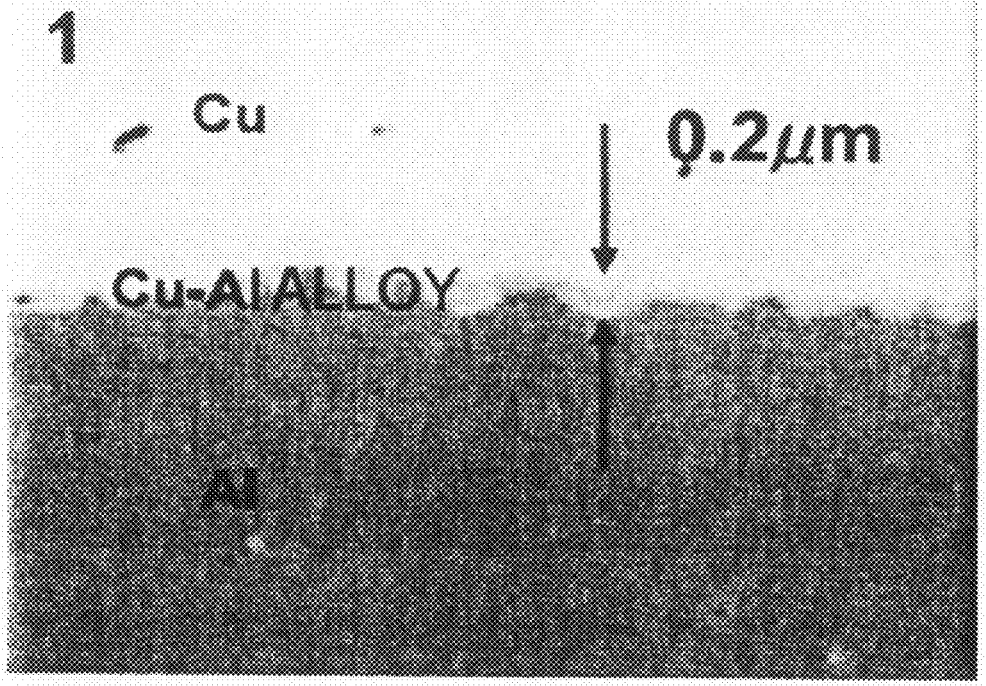
FIGS. 6A and 6B are cross-sectional views, showing a configuration of a junction in the semiconductor device shown in FIG. 5.
Figure 6B:
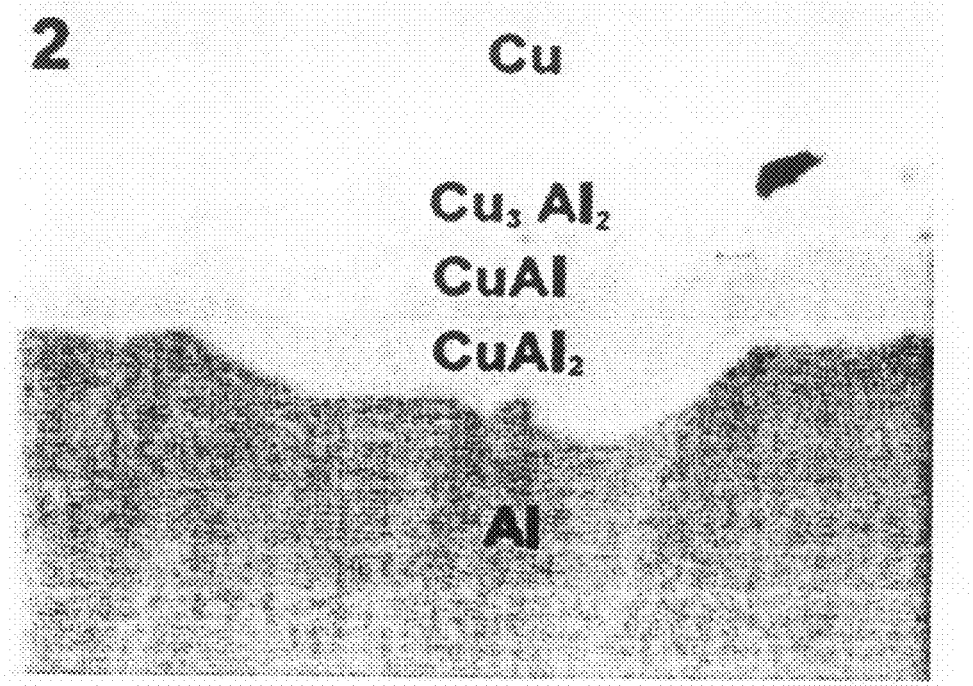
Figure 7A:
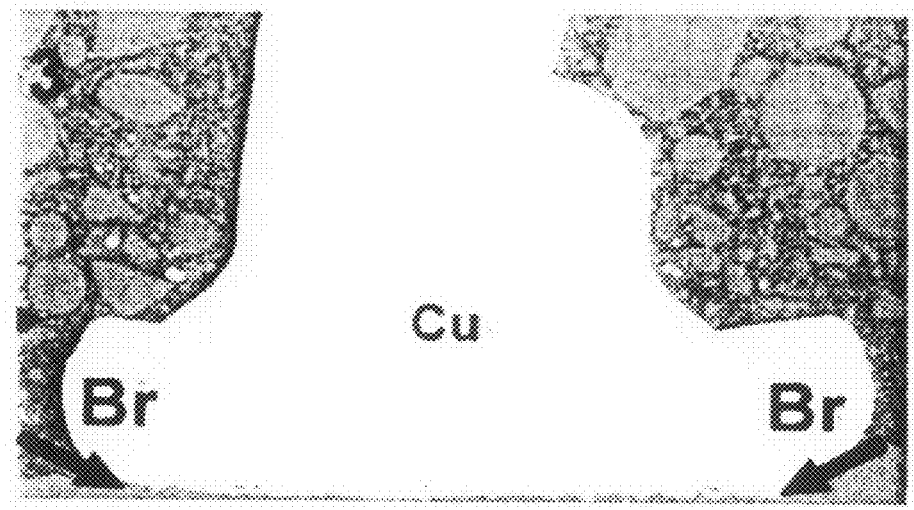
FIGS. 7A and 7B are cross-sectional views, showing the configuration of the junction in the semiconductor device shown in FIG. 5.
Figure 7B:
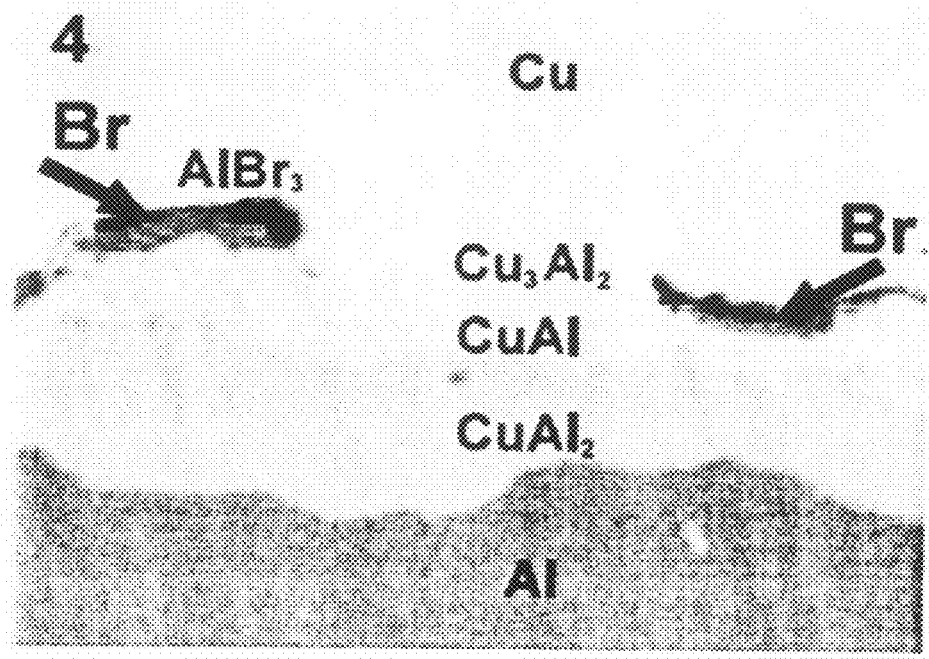
Figure 8A:
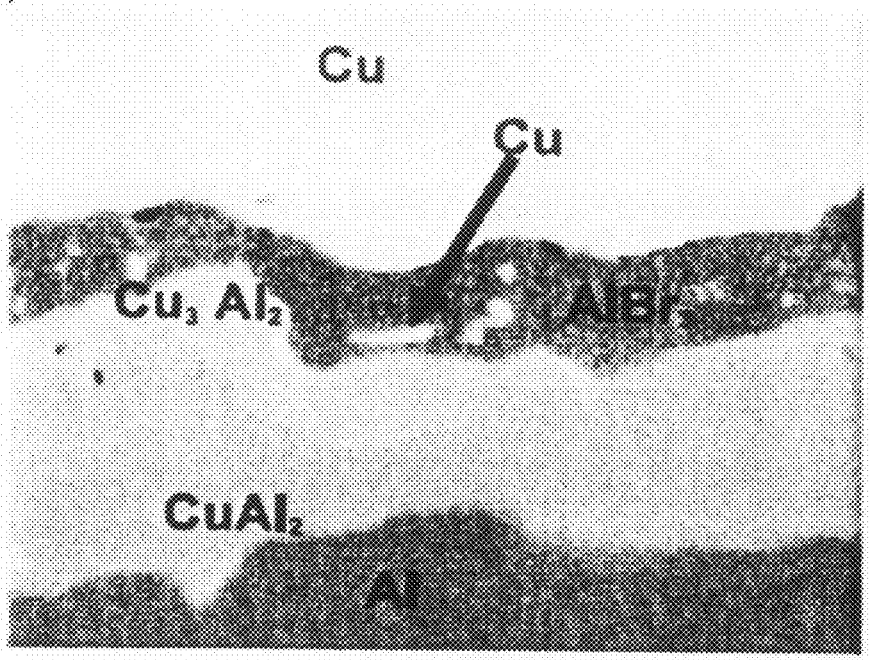
FIGS. 8A and 8B are cross-sectional views, showing the configuration of the junction in the semiconductor device shown in FIG. 5.
Figure 8B:
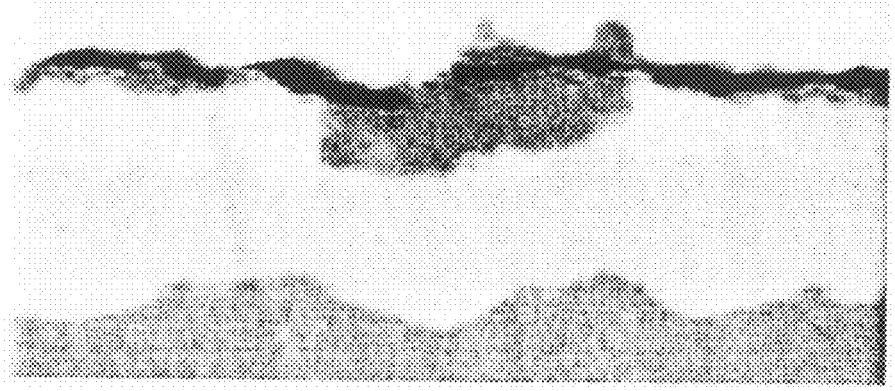

FIGS. 6A and 6B, FIGS. 7A and 7B, and FIGS. 8A and 8B are cross-sectional views, showing a structure of a junction 205 between the Al pad 207 and the Cu ball 213 provided at the head of the Cu wire 211. FIG. 6A shows a condition before the storage at a higher temperature. Further, a series of changes in conditions of the device with time during the storage are shown in FIG. 6B, FIG. 7A, FIG. 7B, FIG. 8A, as the storage time is longer in this sequence, and FIG. 8B shows a condition after the storage.

As shown in FIG. 6A, a junction in an initial stage before the high-temperature storage is provided with a copper-aluminum (CuAl) alloy layer formed to have a thickness of about 0.2 μm.

When such structure is kept at a higher temperature, a counter diffusion is occurred in the junction to form a plurality of alloy layers from a Cu-enriched layer to an Al-enriched layer from the side of the Cu wire 211 toward the side of the Al pad 207, thereby creating $Cu_3Al_2$ in the side of Cu, or namely in a bottom of the Cu ball 213 (FIG. 6B). Further, bromine ion (Br⁻), which is derived from a brominated epoxy resin in the encapsulating resin 215, penetrates into the junction from a circumference portion of the Cu ball 213 (FIG. 7A). $Cu_3Al_2$ is eroded by bromine ion penetrated therein to form aluminum bromide ($AlBr_3$) (FIG. 7B). Such formation of $AlBr_3$ causes Cu in the alloy layer to be pushed out, so that a region containing remained Cu isolated in the interior of $AlBr_3$ is formed (FIG. 8A). Since $AlBr_3$ has higher electric resistance, a formation of such high-resistance layer may cause an open defect (FIG. 8B). Further, since $AlBr_3$ has lower melting point of 97.5 degree C., the volume thereof is decreased in an ambient temperature, and thus a void or a crack may be caused in the $AlBr_3$ layer.

From the above-described analysis results, it was found that a defect is generated when the semiconductor device 200 having the Cu wire 211 and the encapsulating resin 215 containing a brominated epoxy resin is kept at an elevated temperature. Given such analysis results, an exemplary implementation of a configuration of a device, in which progress in the reaction for forming $AlBr_3$ and a corresponding generation of a defect are inhibited, will be described as follows.

First Embodiment

Figure 2:
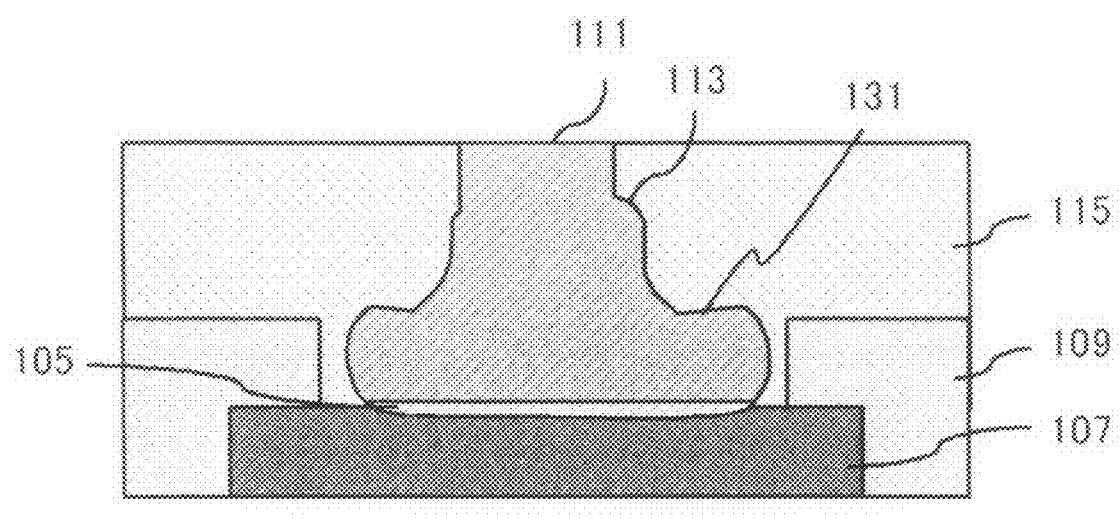
FIG. 2 is a partially-enlarged cross-sectional view of a semiconductor device of FIG. 1.

FIG. 1 is a cross-sectional view, showing a configuration of a semiconductor device of the present embodiment. FIG. 2 is a partially enlarged cross-sectional view of the semiconductor device 100 in FIG. 1, in which a configuration around a region where an electrode pad and a bonding wire are joined is enlarged.

The semiconductor device 100 shown in FIG. 1 and FIG. 2 includes a semiconductor chip 102, electrode pads (AlCu pads 107), which are provided in the semiconductor chip 102 and which contain Al as a major constituent and additionally contain copper (Cu), and wires which contain Cu as a major constituent (CuP wires 111, for example), which function as coupling members for connecting coupling terminals (inner leads 117) provided outside of the semiconductor chip 102 with the semiconductor chip 102, and primarily contain Cu. The CuP wire 111 contains Cu as a major constituent and additionally contains phosphorus (P). A leading edge of the CuP wire 111 forms a ball-shaped CuP ball 113. The AlCu pads 107 and the CuP wires 111 are encapsulated with an encapsulating resin 115 that contains substantially no halogen.

Here, in this Specification, an electrode pad containing Al and Cu as constituent elements is referred to as "AlCu pad 107". In addition, a wire and a ball containing Cu and P as constituent elements are referred to as "CuP wire" and "CuP ball", respectively.

Further, in the semiconductor device 100, the semiconductor chip 102 is provided on the lead frame 121, all of which are encapsulated with the encapsulating resin 115. Other lead frames 119 are provided in the lateral sides of the lead frame 121. Portions of the lead frames 119 are encapsulated with the encapsulating resin 115 to form inner leads 117.

The semiconductor chip 102 is configured to have, for example, a vertical power metal oxide semiconductor field effect transistor (MOSFET, not shown) formed on a substrate such as a semiconductor substrate (a silicon substrate 101) and a multiple-layered film 103 provided thereon composed of stacked interconnect layers, insulating interlayers and the like. The AlCu pads 107 are provided in certain locations on the multiple-layered film 103, and the entire side surfaces and portions of the upper surface of the AlCu pad 107 are covered with a polyimide film 109. In the opening provided in the polyimide film 109, upper surfaces of the AlCu pads 107 are exposed. The exposed portions of the AlCu pad 107 are electrically coupled to the inner leads 117 via the CuP wires 111. One end of the CuP wire 111 forms a CuP ball 113, and the AlCu pad 107 is joined to the CuP ball 113. In the region of the junction between the CuP ball 113 and the AlCu pad 107, a CuAl alloy layer 105 is present on the bottom of the CuP ball 113 (FIG. 2). The junction between the AlCu pad 107 and the CuP ball 113 is coated with the encapsulating resin 115.

In the semiconductor device 100 having such configuration, the CuP wire 111 and the CuP ball 113, are composed of a conductive material primarily containing Cu, typically phosphorus copper (CuP) in this embodiment. Content of phosphorus (P) in the CuP wire 111 is set to be, for example, equal to or greater than 0.01% wt. over the entire CuP wire 111. Such procedure allows further effective inhibition for the formation of copper oxides during the wire bonding process, so that an increase in the resistance of the junction can be inhibited.

Further, content of P in the CuP wire 111 is set to be, for example, equal to or less than 0.03% wt. Such level of content provides a further improved electroconductivity of the wire. More specific compositions of CuP may include a composition of CuP typically containing 99.97% wt. of Cu and 0.03% wt. (300 ppm) of P.

A diameter $\phi$ of the CuP wire 111 may be determined according to a dimension of the AlCu pad 107 and/or a level of integration of the AlCu pads 107. More specifically, the wire diameter of the CuP wire 111 may be determined as being 20 μm or larger and 70 μm or smaller. The diameter of not smaller than 20 μm would provide a further improved reliability in the coupling with the AlCu pad 107. The diameter of not larger than 70 μm would provide further smaller pitches of the pads in the arrangement of the AlCu pads 107, so that the coupling arrangement of the inner leads 117 and the AlCu pads 107 at further higher density.

Besides, the CuP ball 113 is formed in the junction of the CuP wire 111 with the AlCu pad 107.

As shown in the cross-sectional view of FIG. 2, a shoulder 131 having an increased thickness of the ball from the center toward the outer periphery of the ball is provided in the CuP ball 113.

An angle between the shoulder 131 and a horizontal plane may be, for example, 4 degrees or larger and 8 degrees or smaller. If such angle is excessively smaller, there is a concern that it is difficult to support the CuP wire 111 with a capillary during the formation of the junction. On the contrary, if such angle is excessively larger, the capillary has caved in the CuP wire 111 that has first and second spots for being bonded, when the latter of the CuP wire 111 is bonded, so that there is a concern that the CuP wire 111 is damaged.

Besides, the bottom surface of the CuP ball 113 forms, for example, a flat surface in the junction with the AlCu pad 107.

The AlCu pad 107 is an example of electrode pads that contains Al as a major constituent and additionally contains Cu.

Ratio of Al over the whole AlCu pad 107 may be, for example, 50.0% wt. or higher and 99.9% wt. or lower, and ratio of Cu may be, for example, 0.1% wt. or higher and 10.0% wt. or lower. In order to achieve an increased hardness of the electrode pad and an inhibition of a damage of the electrode pad during the wire bonding process, ratio of Cu may be set to be, for example, equal to or higher than 0.1% wt., preferably equal to or higher than 0.2% wt. Besides, in order to inhibit an increase in the film stress, ratio of Cu may be set to be, for example, equal to or lower than 10.0% wt., preferably equal to or lower than 5.0% wt., and more preferably equal to or lower than 3.0% wt.

In addition to above, when the AlCu pad 107 is composed of Al and Cu, ratio of Al over the whole AlCu pad 107 may be more specifically 90.0% wt. or higher and 99.9% wt. or lower.

Besides, if the Cu content in the AlCu pad 107 is excessively lower, the hardness of the AlCu pad 107 is excessively reduced so that there is a concern that the lower layer is damaged in the bonding process, or the initial alloy layer is ununiformly formed so that there is a concern that a stability of the junction is deteriorated. On the other hand, if the Cu content in the AlCu pad 107 is excessively higher, there is a concern that a strength in the junction between the AlCu pad 107 and the CuP wire 111 is reduced. In the ultrasonic bonding, a metal of the wire is rubbed with a metal of the pad by applying ultrasonic wave to cause a relative slip in the surface of the junction, and then newly created surfaces generated by the slip are mutually cohered, so that an adhesion between different metals are actively progressed, thereby creating a junction between different metals. As the Cu content in the AlCu pad 107 is increased, the hardness of the AlCu pad 107 is also increased and thus it is difficult to form a newly created surface, so that there is a fear that a strength in the junction is reduced. Thus, in view of balancing the strength in the junction and the stability of the junction, the Cu content in the AlCu pad 107 may be preferably not equal to or higher than 0.1% wt. and lower than 2% wt., and and more preferably 0.2% wt. or higher and 1% wt. or lower.

The thickness of the region of the AlCu pad 107 where the CuP wire 111 is coupled may be, for example, equal to or larger than ¼ of the thickness of the region of the AlCu pad 107 where the CuP wire 111 is not coupled, and preferably equal to or larger than ½ thereof. When the thickness of the region of the AlCu pad 107 where the CuP wire 111 is coupled is excessively smaller, there is a concern that a layer underlying the AlCu pad 107 is damaged. In addition to above, the upper limit of the thickness of the region of the AlCu pad 107 where the CuP wire 111 is not particularly limited, and may be, for example, not larger than the thickness of the region of the AlCu pad 107 where the CuP wire 111.

Besides, the semiconductor device 100 includes a layer of an alloy of Al and Cu (CuAl alloy layer 105) in the junction between the AlCu pad 107 and the CuP ball 113. In this Specification, a layer of an alloy of Cu and Al is referred to as "CuAl alloy layer". Such CuAl alloy layer includes alloys of variety of content ratios of Cu and Al. Al is a metallic element as a major constituent contained in the AlCu pad 107.

The dimensional area of the layer of alloy of Al and Cu is equal to or larger than 50% of the dimensional area of the coupling portion between the AlCu pad 107 and the CuP wire 111.

The CuAl alloy layer 105 is a layered region, which is formed by a diffusion of Al in the AlCu pad 107 and Cu in the CuP ball 113 due to a heating in the process for forming the junction, and contains Cu and Al as major constituents. Here, the term "contains Cu and Al as major constituents" means that sum of the content of Cu and the content of Al is larger than 50% wt. over the whole CuAl alloy layer 105.

Figure 3:
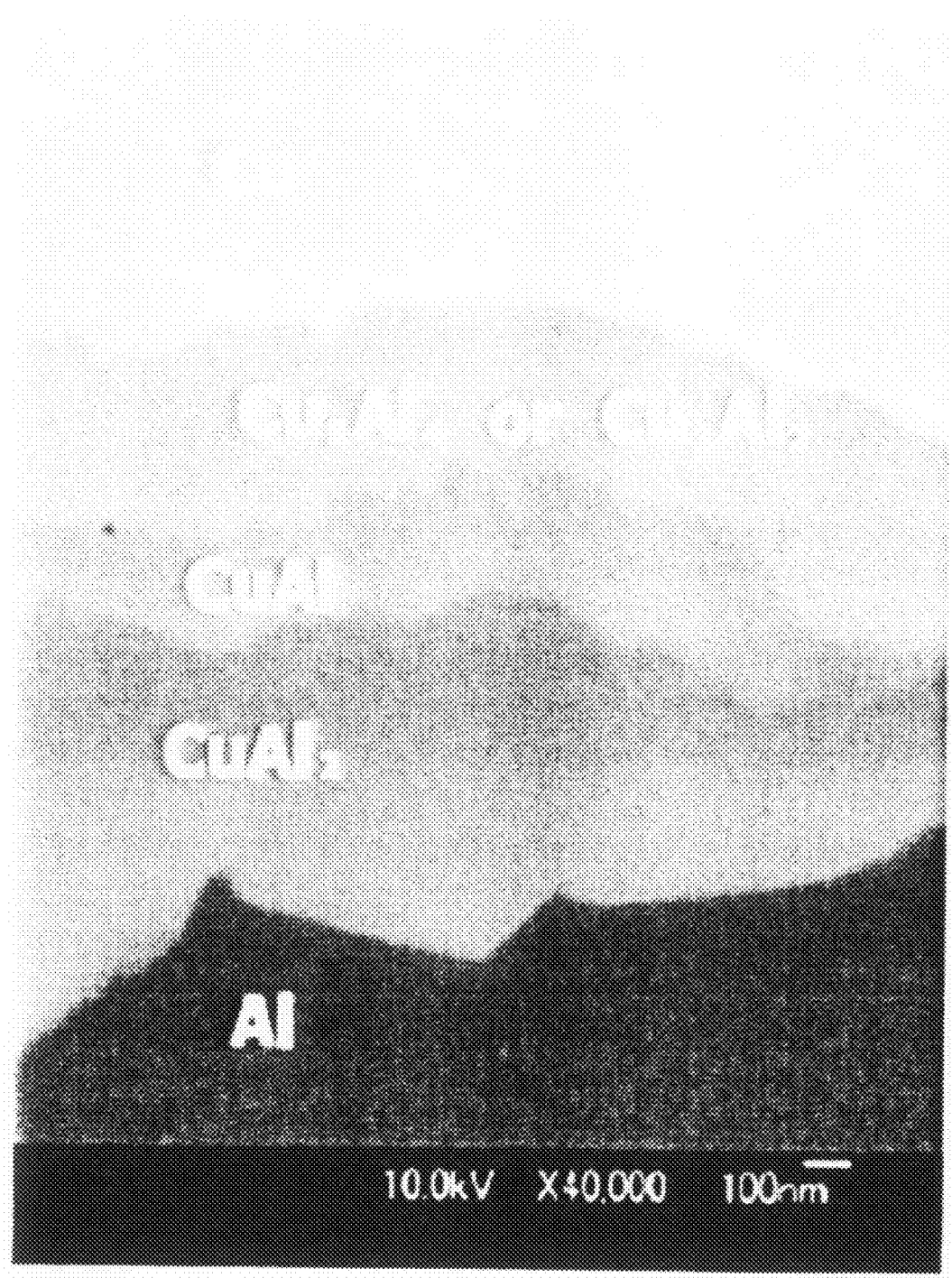
FIG. 3 is a cross-sectional view, showing a configuration of a junction between an electrode pad and a bonding pad of a semiconductor device in an embodiment.

FIG. 3 is a cross-sectional view, specifically illustrating a configuration of the CuAl alloy layer 105. As shown in FIG. 3, the CuAl alloy layer 105 is composed of a plurality of layers of Cu and Al (CuAl alloy layers) having different composition ratio of Al and Cu. The CuAl alloy layers are step-wise formed to have a composition distribution of Cu and Al, in which the ratio of Cu is relatively decreased and the ratio of Al is relatively increased from the side of the CuP ball 113 toward the side of the AlCu pad 107. More specifically, a plurality of alloy layers is provided in the CuAl alloy layer 105 to form a gradation-like distribution of content ratios, in which the content ratio of Cu is relatively decreased and the content ratio of Al is relatively increased, from the side of the CuP ball 113 toward the side of the AlCu pad 107.

The alloy layers includes, more specifically, a $CuAl_2$ layer and a layer provided between the $CuAl_2$ layer and the CuP ball 113 and having an Al content ratio that is relatively lower than that of the $CuAl_2$ layer. The layer provided between the $CuAl_2$ layer and the CuP ball 113 and having an Al content ratio that is relatively lower than that of the $CuAl_2$ layer includes a CuAl layer having a content ratio of Cu and Al of 1:1 and a layer provided between the CuAl layer and the CuP ball 113 and having an Al content ratio that is relatively lower than that of the CuAl layer.

In the exemplary implementation shown in FIG. 3, the multiple-layered structure contains, from the top thereof, a CuP ball 113 (Cu layer), a $Cu_9Al_4$ layer or $Cu_3Al_2$ layer, a CuAl layer, a $CuAl_2$ layer, and an AlCu pad 107 (Al layer).

As described above, CuAl alloy layer 105 is, for example, a layer composed of an intermetallic compound of Cu and Al, and contains, for example, $CuAl_2$ layer. In addition, the CuAl alloy layer 105 may further include a CuAl layer and a $Cu_9Al_4$ layer or a $Cu_3Al_2$ layer.

The thickness of each of the layers constituting the CuAl alloy layer 105 is not particularly limited, and typically for example about 200 to 300 nm. Further, as shown in FIG. 3, interfaces between each of the layers constituting the CuAl alloy layer 105 may be an uneven surface. Further, from the upper viewpoint, such uneven surface may be formed over the entire surface of the junction region.

While FIG. 2 and FIG. 3 illustrate the configuration, in which the CuAl alloy layer 105 clearly appears in the bottom of the CuP ball 113, any configuration of the semiconductor device 100 may be employed provided that the CuAl alloy layer 105 definitely appears in at least a portion of the CuP ball 113 by the heating process, and it is not required to have the definitely layered structure of the CuAl alloy layer 105 in the semiconductor device 100 in the condition before the use. Even if the semiconductor device 100 in the condition before the use does not have the definitely layered structure of the CuAl alloy layer 105, once the use of the semiconductor device 100 is started to heat the vicinity of the junction with the CuP ball 113 and AlCu pad 107, then the CuAl alloy layer 105 more clearly appears.

The encapsulating resin 115 contains substantially no halogen. More specifically, the encapsulating resin 115 is a heat-resistant resin, which is composed of a resin composition contain substantially no halogen or antimony. A concentration of a halogen inevitably mixed in the encapsulating resin 115 for each of halogen elements may be, for example, equal to or lower than 1,000 ppm, and preferably equal to or lower than 100 ppm. In addition, a total concentration of halogens inevitably mixed in the encapsulating resin 115 may be, for example, equal to or lower than 1,000 ppm, and preferably equal to or lower than 100 ppm.

The resin contained in the encapsulating resin 115 is composed of a polymer compound having substantially no halogen group in molecular backbone. For example, the resin in the encapsulating resin 115 is composed of a polymer compound having substantially no Br group in molecular backbone. The encapsulating resin 115 may contain one type of resin, or may contain multiple types of resins.

Further, the encapsulating resin 115 contains no halide even in the components except the resin, for example, additives such as fire retardant agents and the like.

Such types of resin compositions typically include, more specifically: resin compositions containing alternative fire retardant agent-containing resin such as metal hydrates; high filler-loading resin compositions containing fillers such as fused spherical silica and the like at a level of, for example equal to or higher than 80% wt., and preferably equal to or higher than 85% wt. over the whole resin composition; and resin compositions containing polymer compounds having fire retardant backbone such as phenolic resins, epoxy resins and the like. These may be employed alone, or combinations thereof may be employed.

Typical metal hydrates more specifically include aluminum hydroxide and magnesium hydroxide. Other alternative fire retardant agents more specifically include inorganic phosphorus and organic phosphorus compounds. Combinations of the metal hydrate and the polymer compound having substantially no halogen group in molecular backbone may also be employed.

In polymer compounds having fire retardant backbone, phenolic resins having fire retardant backbone typically include, for example, novolac structure phenolic resins having biphenyls or naphthalenes in its molecular. More specifically, the phenolic resins include: phenolic aralkyl resins such as phenolic biphenylene aralkyl resins, phenolic phenylene aralkyl resins, phenolic diphenyl ether aralkyl resins and the like; bisphenol fluorene-containing phenolic novolac resins; bisphenol S-containing phenolic novolac resins; bisphenol-F containing phenolic novolac resins; bisphenol-A containing phenolic novolac resins; naphthalene-containing phenolic novolac resins; anthracene-containing phenolic novolac resins; fluorene-containing phenolic novolac resins; and condensed polycyclic aromatic phenolic resins. These may be employed alone, or combinations thereof may be employed.

Epoxy resins having fire retardant backbone include, for example, novolac structure epoxy resins having biphenyls or naphthalenes in its molecular. More specifically, epoxy resins include: phenolic aralkyl epoxy resins such as phenolic biphenylene aralkyl epoxy resins, phenolic phenylene aralkyl epoxy resins, phenolic diphenyl ether aralkyl epoxy resins and the like; bisphenol fluorene-containing novolac epoxy resins; bisphenol-S-containing novolac epoxy resins; bisphenol-F-containing novolac epoxy resins; bisphenol-A-containing novolac epoxy resins; naphthalene-containing novolac epoxy resins; anthracene-containing novolac epoxy resins; fluorene-containing novolac epoxy resins; and condensed polycyclic aromatic epoxy resins. These may be employed alone, or combinations thereof may be employed.

Since further improved adhesiveness between the encapsulating resin 115 and the member to be encapsulated can be provided by employing the resin composition containing the polymer compound having fire retardant backbone, as compared with the case that employs a resin composition additionally containing an alternative fire retardant agent, such resin composition can be more preferably employed even in the case that includes, for example, the AlCu pad 107 having relatively larger dimensional area.

Next, the method for manufacturing the semiconductor device 100 will be described.

First of all, the multiple-layered film 103 composed of the stacked interconnect layers, insulating interlayers and the like is formed on the substrate such as the semiconductor substrate (the silicon substrate 101). Next, the AlCu pads 107 are formed in certain locations on the multiple-layered film 103 via a sputter process. The thickness of the AlCu pad 107 is set to be, for example equal to or larger than 2.5 µm. Subsequently, the polyimide film 109 is formed via a coating process so as to cover the AlCu pad 107. Subsequently, the polyimide film 109 is patterned to provide openings, so that portions of the AlCu pads 107 are exposed. The semiconductor chip 102 is thus obtained.

The obtained semiconductor chip 102 is mounted on the lead frame 121, and the wire bonding between the AlCu pads 107 and the inner leads 117 are carried out via the CuP wires 111. CuP ball 113 is formed in the bonding process.

In such case, a member having an inclined end portion is employed for the capillary that supports the CuP wire 111. Inclination angle of the capillary is suitably selected according to the geometry of the shoulder 131, and for example, 4 degrees or larger and 8 degrees or smaller. This allows forming the shoulder 131 of the CuP ball 113 to have a geometry, in which the shoulder is gradually drawn away from the upper surface of the AlCu pad 107 from the center toward the periphery of the CuP ball 113.

In addition, the bonding process is carried out within a chamber such as a glass chamber. Atmosphere in the chamber may be selected to be composed of, for example 5% vol. of hydrogen gas ($H_2$) and 95% vol. of nitrogen gas ($N_2$). Such configuration of employing CuP for the material of the bonding wire and conducting the bonding process within the above-described atmosphere allows reducing an oxidization during the bonding process, and preferentially oxidizing P in the CuP wire 111 even if the oxidization is caused, such that a formation of Cu oxides is prevented to reduce an increase in the resistance of the junction.

The bonding process is carried out by the following procedure:

step 11: the CuP ball 113 having a certain diameter is formed in the forefront of the CuP wire 111;

step 12: the CuP ball 113 is lifted down substantially perpendicularly to the upper surface of the AlCu pad 107; and step 13: the CuP ball 113 is brought into contact with the AlCu pads 107, and then a load applied to the CuP ball 113 is reduced as compared with the case of the step 12, and ultrasonic vibration is applied.

In the step 12 of the above-described procedure, the CuP ball 113 is shaped along the geometry of the forefront of the capillary to form the shoulder 131. In addition, the bottom thereof is in contact with the AlCu pads 107 to form flat junction surfaces. In the step 12, more specifically, a larger load of, for example, about 400 g to 1 kg is applied for about 0.1 msec. to 10 msec. without providing ultrasonic vibration to the CuP ball 113 to vertically lift the CuP ball 113 down toward the top of the AlCu pad 107. This allows preventing the portion of the AlCu pad 107 contacted with CuP ball 113 from excessively sinking when the AlCu pad 107 is in contact with the CuP ball 113, so as to avoid providing excessively smaller thickness of the pad or a deterioration of the underlying devices. In addition, sufficient area for the junction can be assured by utilizing the flat portion of the bottom surface of the CuP ball 113.

In the step 13, a load applied to the CuP ball 113 is reduced to, for example, about ⅕ of that applied in the step 12, and ultrasonic vibration is provided. Here, the time for applying the load in the step 13 is set to be, for example, about 0.5 msec. to 20 msec. Ultrasonic vibration is provided while applying the load to the CuP ball 113, so that a native oxide film, which may be formed in the upper surface of the AlCu pad 107, can be removed to create new surface, and thus the CuP ball 113 is in contact with such newly created surface. Thus, an improved reliability of the junction of the CuP ball 113 with the AlCu pad 107 can be achieved. The procedure of applying a reduced load that is lower than the load applied in the step 12 and providing ultrasonic vibration allows inhibiting a pushing out of the AlCu pad 107 by the CuP ball 113, so that the thickness of the AlCu pad 107 in the region where the CuP ball 113 is coupled is equal to or larger than ¼ of the thickness of the AlCu pad 107 in the region where the CuP ball 113 is not coupled. Since the newly created surface is formed in the step 12, sufficient strength in the junction is obtained and sufficient thickness of the AlCu pad 107 is assure, even if the load is reduced, and therefore ununiformity in the thickness of the formed CuAl alloy layer 105 serving as the junction is reduced. Therefore, homogeneous CuAl alloy layer 105 can be formed to provide an improved junction reliability. Further, a damage to the underlying device can be reduced by reducing load.

Thereafter, the lead frame 121, the semiconductor chip 102, the CuP wires 111 and the inner leads 117 are encapsulated with the encapsulating resin 115. The semiconductor device 100 shown in FIG. 1 and FIG. 2 is thus obtained by the above-described procedure. While the CuAl alloy layer 105 shown in FIG. 2 is present within the obtained semiconductor device 100, the use of the semiconductor device 100 thereafter causes the CuAl alloy layer 105 to be more clearly appeared.

Next, advantageous effects obtainable by employing the configuration of the semiconductor device 100 will be described.

In the semiconductor device 100 shown in FIG. 1 and FIG. 2, the CuP wires 111 are joined to the AlCu pads 107, the $CuAl_2$ layer and the layer having the Al content ratio that is relatively lower than that of the $CuAl_2$ layer are formed in the junction from the side of the AlCu pad 107 toward the side of the CuP ball 113 in this sequence. Thus, the configuration of achieving a stable formation of the alloy layer in the junction region in the initial stage of the junction process to reduce an excessive growth of the alloy layer during the operation at higher temperature and to provide an improved coupling reliability during the operation at higher temperature can be presented. Such advantageous effect is more considerably exhibited when the CuAl alloy layer 105 is configured to have three or more layers having different compositions, which are arranged to provide a profile of the Al content ratio to be decreased from the side of the AlCu pad 107 toward the side of the CuP ball 113.

Further, in the semiconductor device 100, the coupling portions therebetween are encapsulated with the halogen-free encapsulating resin 115. Thus, since a corrosion of the CuAl alloy layer 105 with halogen in the encapsulating resin 115 is inhibited, a growth of voids by the corrosion of the CuAl alloy layer 105 and a growth of a high-resistance layer can be inhibited. Thus, the semiconductor device 100 is configured to provide a considerably improved coupling reliability during the operation at higher temperature for longer term, as compared with the conventional configuration, which primarily employs an encapsulating resin composed of a resin composition containing halogen.

As described above in reference to FIGS. 6A, 6B, FIGS. 7A, 7B and FIGS. 8A, 8B, it is considered that the coupling defect between the electrode pad and the bonding wire is caused due to a chemical reaction for forming $AlBr_3$ and the like, and the semiconductor device 100 is configured that the specified materials are selected the electrode pads, wires and the encapsulating resin, respectively, and the junction between the electrode pad and the wire is configured that a plurality of alloy layers are arranged therein by a specified sequence. Thus, by these synergistic effects, an improved junction reliability during the operation at higher temperature can be stably achieved in the semiconductor device 100, irrespective of the diameter of the CuP wire 111. Such advantageous effect is more considerably exhibited when Cu content in the AlCu pad 107 is lower than 2% wt.

In addition, the semiconductor device 100 is configured to have an improved flexibility in the operating temperature. Further, an open defect caused by a propagation of a crack can be inhibited in the semiconductor device 100, if a crack is generated in the portion of the junction region during the operation at higher temperature.

In addition, in the semiconductor device 100, the electrode pad contains Al and Cu as essential constituents. Thus, even if the electrode pad is joined to the bonding wire containing Cu as a major constituent, which is harder than Au or Au alloy, an excessive thinning of the junction region in the electrode pad during the process for forming the junction can be inhibited, so that an improved manufacturing yield is achieved.

Further, since the bonding wire in the semiconductor device 100 contains Cu as a major constituent, a reduced volumetric resistivity of the wire by about 30%, for example, can be provided, as compared with the case of employing Au wire. Thus, an improved electroconductivity of the bonding wire can be achieved. Further, a formation of an intermetallic compound during a high-temperature storage and a formation of Kirkendall voids can be reduced, as compared with the case of employing Au wire, thereby providing an improved reliability. Further, material costs can be reduced by about 50 to 90%, for example, as compared with the case of employing Au wire, thereby achieving a considerable reduction in the manufacturing costs of devices.

Further, since the bonding wire contains P, a formation of Cu oxides during the bonding process is effectively inhibited, even if the bonding wire primarily contains Cu. Thus, an increase in the resistance in the junction can be prevented, thereby presenting an improved electroconductivity. Thus, the wire having a reduced cross sectional area by about 30% as compared with the case of employing Au wire, can be employed. Further, the wire having a reduced hardness as compared with the case of employing a wire composed of only Cu can be employed, so that a facility of creating the bonding can be enhanced. In addition, P is not indispensable and the bonding wire may contain no P.

Further, since the CuP ball 113 has the shoulder 131 that has the geometry rising from the center toward the periphery of the ball and also has the cross-sectional geometry having the thickness increasing from the center toward the periphery of the ball, further improved manufacturing yield in the bonding process can be achieved.

In the following embodiment, technical features that are not the same as in first embodiment will be described.

Second Embodiment

While the exemplary implementation configured to have the electrode pads and the inner leads that are coupled with the bonding wires is described in first embodiment, the terminals for providing external couplings that are coupled to one end of the bonding wire, another end of which is coupled to the electrode pad, is not limited to the inner lead, and other type of member may alternatively employed. For example, the wire bonding may be formed from the electrode pad of the semiconductor chip to an interconnect provided on a printed circuit board.

Figure 4:
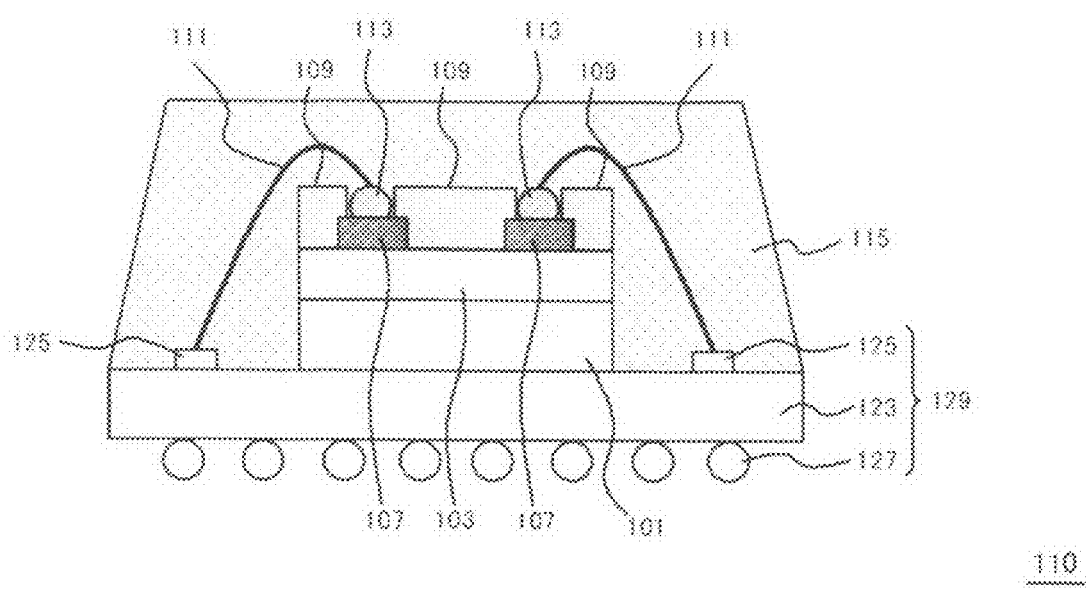
FIG. 4 is a cross-sectional view, illustrating a configuration of a semiconductor device in an embodiment.

FIG. 4 is a cross-sectional view, illustrating a semiconductor device having such configuration. Fundamental configurations of a semiconductor device 110 shown in FIG. 4 is similar to the configuration of the semiconductor device 100 shown in FIG. 1, except that a ball grid array (BGA) substrate 129 is provided, instead of the lead frame 121 and the lead frame 119.

The BGA substrate 129 includes a printed circuit board 123 having a semiconductor chip 102 mounted thereon, interconnects 125 provided in certain positions of the printed circuit board 123 and a plurality of bumps 127 provided on a surface opposite to the chip-mounting surface of the printed circuit board 123. The CuP wire 111 is coupled to the AlCu pad 107 and to the interconnect 125. The whole region for mounting chips on the printed circuit board 123 is encapsulated with the encapsulating resin 115.

Since the semiconductor device 110 shown in FIG. 4 is also configured that the CuP wire 111 is coupled to the AlCu pad 107 and a halogen-free fire retardant encapsulating resin 115 is employed, the advantageous effect same as the semiconductor device 100 shown in FIG. 1 is obtained.

While embodiments of the present invention has been fully described in reference to the annexed figures, it is intended to present these embodiments for the purpose of illustrations of the present invention only, and various modifications thereof are also available.

For example, while the exemplary implementation related to the electrode pad made of Al and Cu has been described in the above-described embodiments, the material of the electrode pad is not limited thereto as long as the material contains Al as a major constituent and further contains Cu, and a metallic material containing Al as a major constituent and further containing Si and Cu, such as AlSiCu, may also be employed. More specifically, the material of the electrode pad may be AlSiCu containing 98.5% wt. of Al, 1.0% wt. of Si and 0.5% wt. of Cu.

Further, while the exemplary implementation of employing CuP for the material of the bonding wire coupled to the AlCu pad 107 is described in the above-described embodiment, the material of bonding wire is not particularly limited thereto, as long as the material primarily contains Cu. For example, the bonding wire may be composed of a material that contains no P.

Further, while the exemplary implementation of the semiconductor device configured to provide the polyimide film 109 on the AlCu pad 107 is described in the above-described embodiment, an alternative configuration having no polyimide film 109 may also be employed.

Further, in the above-described embodiments, a barrier layer serving as a layer underlying the AlCu pad 107 may be further provided. Specific examples of such barrier layer include a TiN layer, a combination of TiN layer (pad side)/Ti layer (substrate side), a WSi layer, a MoSi layer, a TiSi layer and the like.

Further, the technology of the present invention can be applied to various types of semiconductor packages that are configured to be encapsulated with resins such as epoxy resins and the like, and it is needless to add that the technology of the present invention is not particularly limited to the configurations as described above in the embodiments such as the packages of BGA and the like.

Further, while the exemplary implementation of the bonding wire, which is employed for the electroconductive coupling member that couples the bonding pad with the conductive member in the semiconductor chip, is described in the above-described embodiment, other types of coupling members such as a ball-shaped coupling member, a ribbon-shaped coupling member and the like may also be employed.

EXAMPLES

Example 1

In the present example, a wire containing Cu and P (CuP wire) was joined to an electrode pad containing Al and Cu (AlCu pad), and then the structure of the junction after the high-temperature storage was analyzed. Compositions, conditions for the bonding process and conditions for the storage at higher temperature of the electrode pads and the wires are shown below:

electrode pad: 99.5% wt. of Al and 0.5% wt. of Cu; wire: 99.9% wt. of Cu and 0.1% wt. of P, diameter of 50 μm;
bonding conditions: at a temperature of 200 degree C. and with a load of 100 to 600 g; and
storage conditions: at a temperature of 175 degree C. for 1,000 hours.

Figure 9:
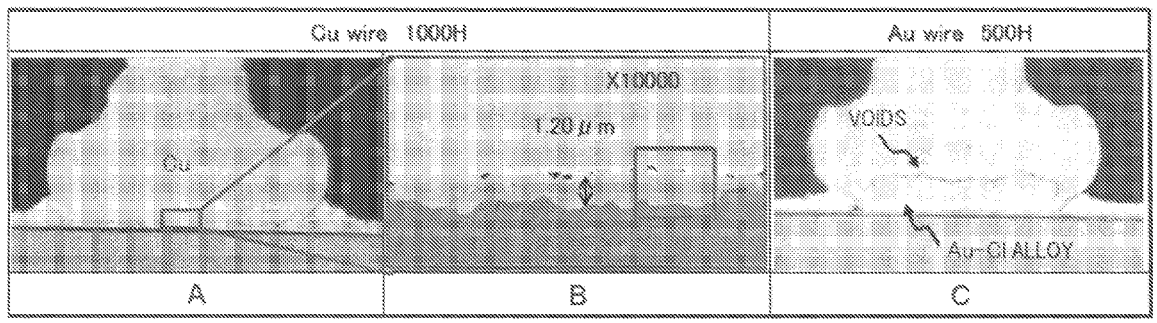
FIGS. 9A, 9B and 9C are cross-sectional views, showing junction structures between the electrode pad and the wire in Example.
Figure 10:
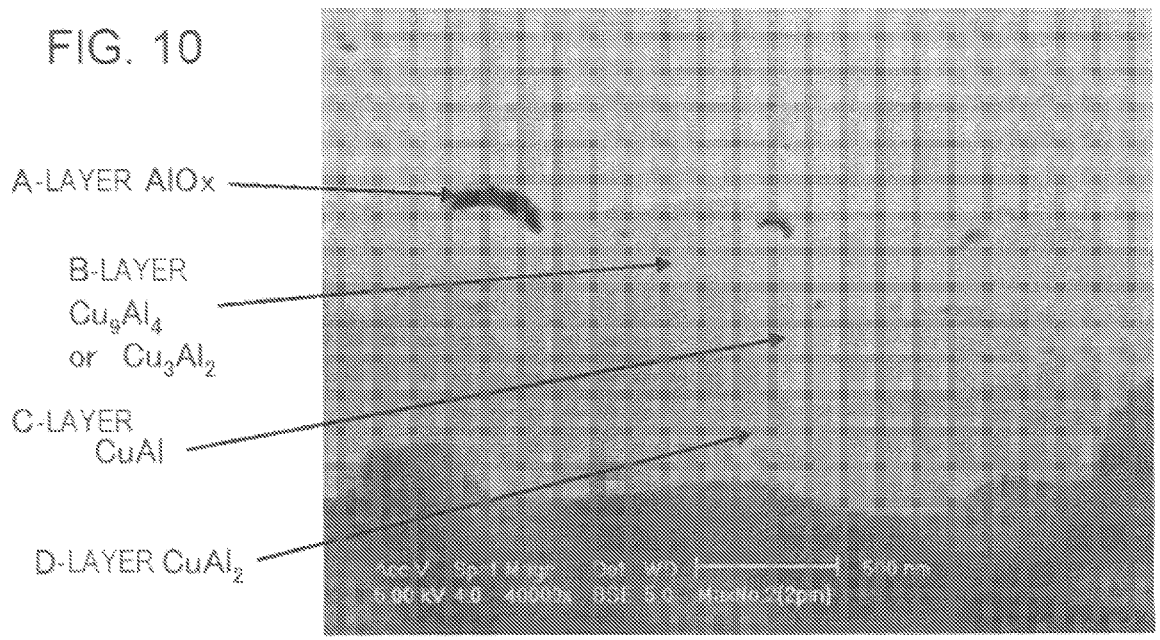
FIG. 10 is a cross-section showing a junction structure between the electrode pad and the wire in Example.
Figure 11A:
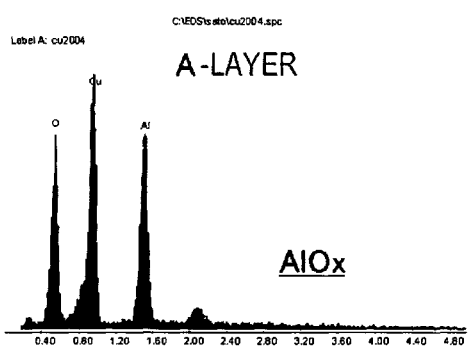
FIG. 11A to FIG. 11D are charts, showing analysis results for junction layers between the electrode pad and the wire in Example.
Figure 11B:
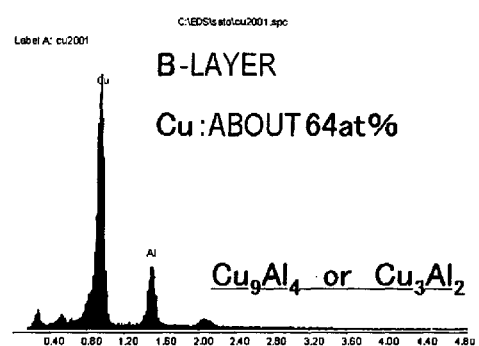
Figure 11C:
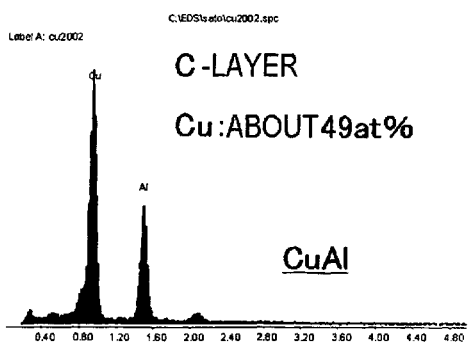
Figure 11D:
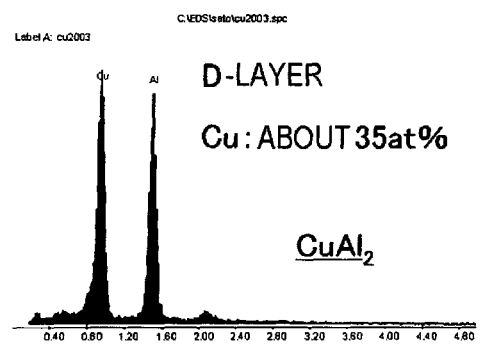

FIG. 9A is a cross-sectional view, showing the junction structure after the high-temperature storage, and FIG. 9B is a cross-sectional view, showing an enlarged view of a region indicated with a square frame in FIG. 9A. FIG. 10 is a cross-sectional view, showing a further enlarged view of a region indicated with a square frame in FIG. 9B. As can be seen from FIG. 9A and FIG. 9B, a junction layer having a dimension of about 1.2 μm is uniformly formed. In addition, while the thickness of the electrode pad in the junction was reduced as compared with the thickness before forming the junction, it was found that the electrode pad remained over the entire junction.

Figure 19:
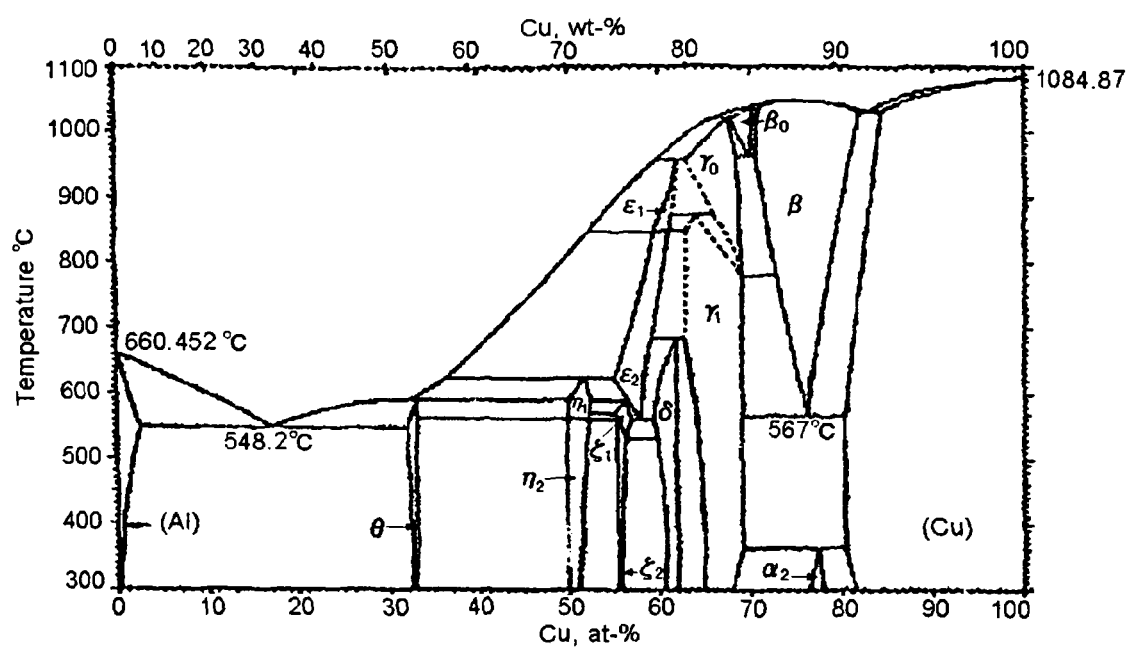
FIG. 19 is a phase diagram of an Al—Cu alloy.

As can be seen from FIG. 10, it was found that the junction layer is mainly composed of at least three layers (B to D layers in FIG. 10). Thus, the compositions of A to D layers in FIG. 10 were obtained via an X-ray diffraction. FIG. 11A to FIG. 11D are charts, showing analysis results for A to D layers, respectively. In reference to the phase diagram of Al—Cu alloy shown in FIG. 19 (originally included in Hyoung-Joon Kim et al., entitled "Effects of Cu/Al Intermetallic Compound (IMC) on Copper Wire and Aluminum Pad Bondability", IEEE Transactions on Components and Packaging Technologies, Vol. 26, No. 2, June, 2003.), FIG. 11A to FIG. 11D provide the composition of each of the layers as follows.

A layer: $AlO_x$;
B layer: $Cu_9Al_4$ or $Cu_3Al_2$;
C layer: CuAl; and
D layer: $CuAl_2$.

On the other hand, FIG. 9C shows the condition of the junction, which was formed by joining an Au wire (diameter of 50 μm) with an Al—Si—Cu pad (98.5% wt. of Al, 1% wt. of Si and 0.5% wt. of Cu) and then was kept at a temperature of 175 degree C. for 500 hours. As can be seen from FIG. 9C and FIG. 9A, it was found that a generation of voids due to the growth of the alloy layer and the growth of the alloy itself in the junction can more effectively be inhibited by employing the wire containing Cu as the major constituent and the AlCu pad.

Example 2

In the present example, an influence of the material of the electrode pad employed with the CuP wire over the condition of the formed alloy layer in the junction at the initial stage was evaluated.

A CuP wire having a composition that is the same as the wire employed in Example 1 was employed for the wire. An AlCu pad having a composition that is the same as the wire employed in Example 1 or an AlSi pad (99% wt. of Al, 1% wt. of Si) was employed for the electrode pad.

Figure 12A:
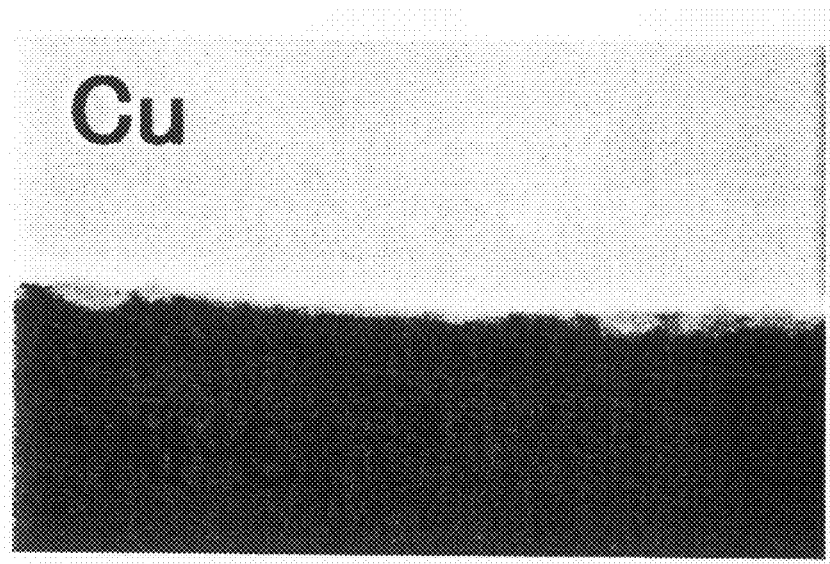
FIGS. 12A and 12B are cross-sectional views, showing junction structures between the electrode pad and the wire in Example.
Figure 12B:
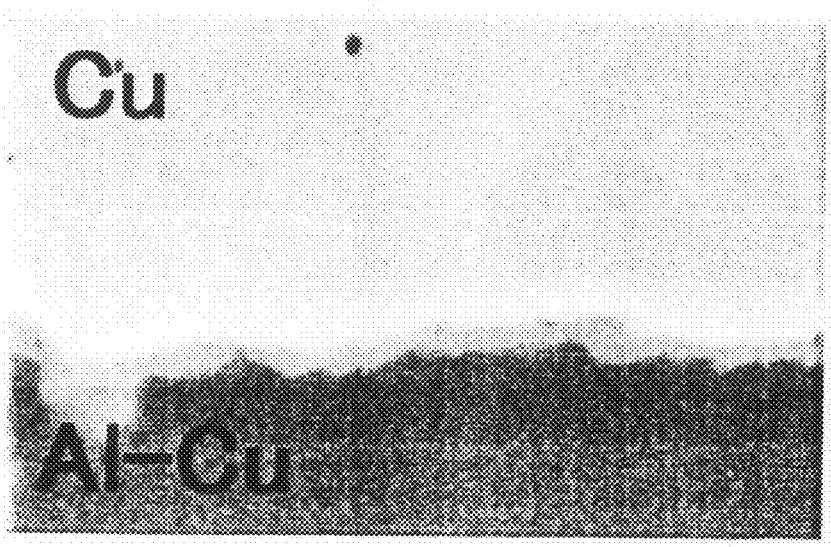

FIG. 12A is a cross-sectional view, showing the junction just after forming the junction of the specimen employing an AlSi pad, and FIG. 12B is a cross-sectional view, showing the junction just after forming the junction of the specimen employing an AlCu pad. As can be seen from FIG. 12A, in the specimen employing the AlSi pad, regions where the alloy layer is not fully formed is present in the junction region just after forming the junction. On the contrary, in the specimen employing the AlCu pad, the alloy layer is fully formed over the entire junction region, as shown in FIG. 12B.

Example 3

In the present example, an influence of the material of the electrode pad employed with the CuP wire over a structure and a resistance for high-temperature storage of the junction was evaluated. A CuP wire having a composition that is the same as the wire employed in Example 1 was employed for the wire, and the following samples employing different electrode pad materials were manufactured.

sample 1: AlSiCu pad (98.5% wt. of Al, 1% wt. of Si, 0.5% wt. of Cu);
sample 2: AlCu pad (99.5% wt. of Al, 0.5% wt. of Cu); and
sample 3: AlSi pad (99% wt. of Al, 1% wt. of Si);

FIG. 13 includes cross-sectional views, showing the configurations just after forming the junctions in the samples 1 to 3. In addition to above, FIG. 13 also includes results of the measurements for share strength in the junction corresponding to the strength in the junction. The share strength was obtained by measuring a shear strength when a force along the transverse direction is applied to the portion above the pad surface by 2 to 6 μm with a metal tool.

It was found from FIG. 13 that, while the electrode pad was remained over the entire junction region when the electrode pads containing Cu as the constituent element were employed (see samples 1 and 2), a region where the electrode pad was not present was formed due to an excessive bite of the ball when the AlSi pad which did not contain Cu was employed (see sample 3).

In addition, 15 specimens were manufactured for each of the samples 1 to 3 and the conditions under the electrode pad were confirmed by conducting a stripping with aqua regia, and the results thereof show that no stripping was found for all 15 specimens for samples 1 and 2, while a stripping was found for 2 specimens among 15 specimens for sample 3.

Next, a fluctuation in the ON resistance of the transistor was measured for each of the samples 1 and 2, which were encapsulated with a Br-free resin and kept at 200 degree C. In addition, similar measurements as above-described were also conducted for new samples that employ electrode pads and wires corresponding to the samples 1 and 2 and are encapsulated with a resin containing Br (samples 4 and 5). Measurement results are shown in FIG. 14.

Figure 14:
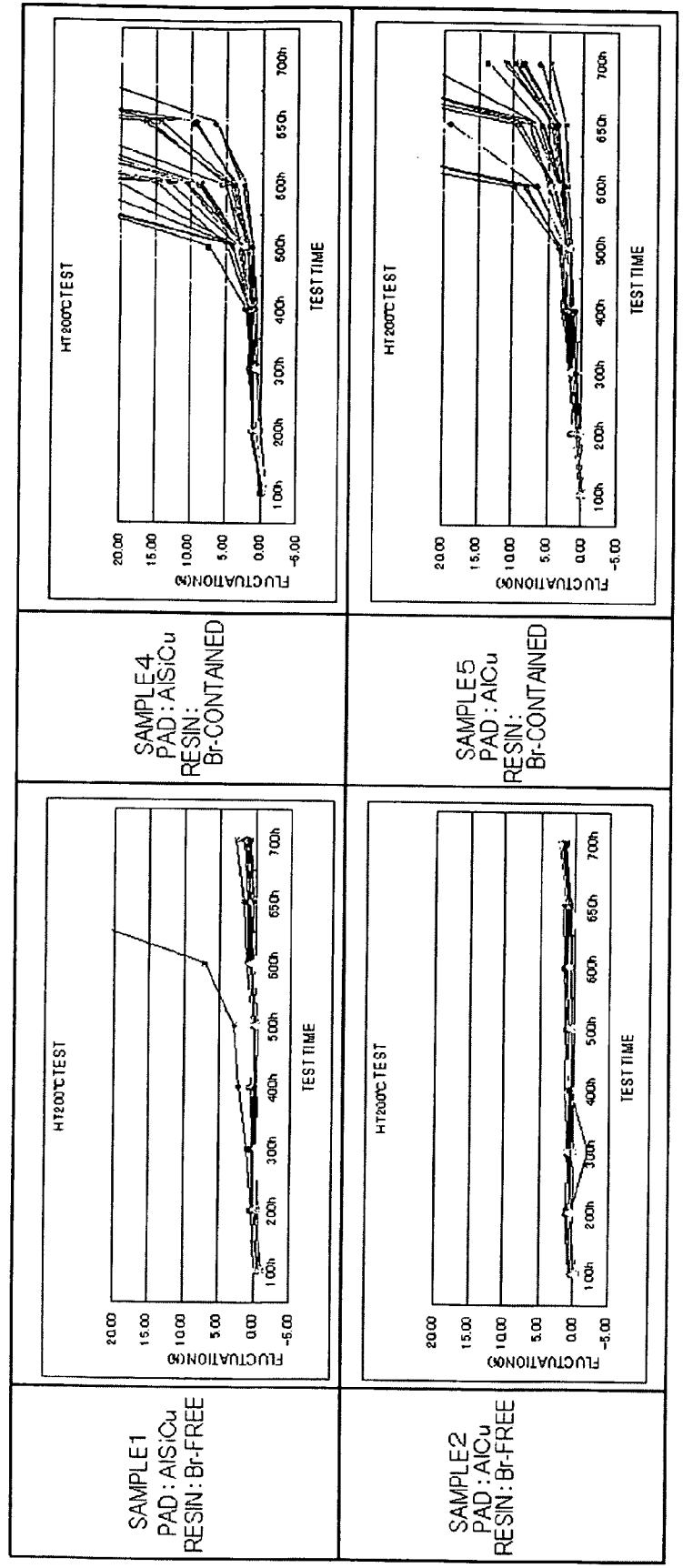
FIG. 14 includes charts, showing analysis results of high-temperature storage of junctions between the electrode pad and the wire in Example.

As can be seen from FIG. 14, an increased fluctuation in the electric resistance for ON-state of the transistor in the operation at a higher temperature of 200 degree C. was able to be inhibited by employing the electrode pad containing Cu and encapsulating with the Br-free resin.

FIG. 15A is a cross-sectional view, showing a configuration of a junction in the sample 5 after a storage at 175 degree C. for 2,350 hours, and FIG. 15B shows an enlarged view of a region indicated by a square in FIG. 15A. FIG. 16 and FIG. 17 includes spectrums, which were obtained by measurements of energy dispersive X-ray spectroscopy (EDS) for point 1 to point 6 in FIG. 15B.

Figure 15:
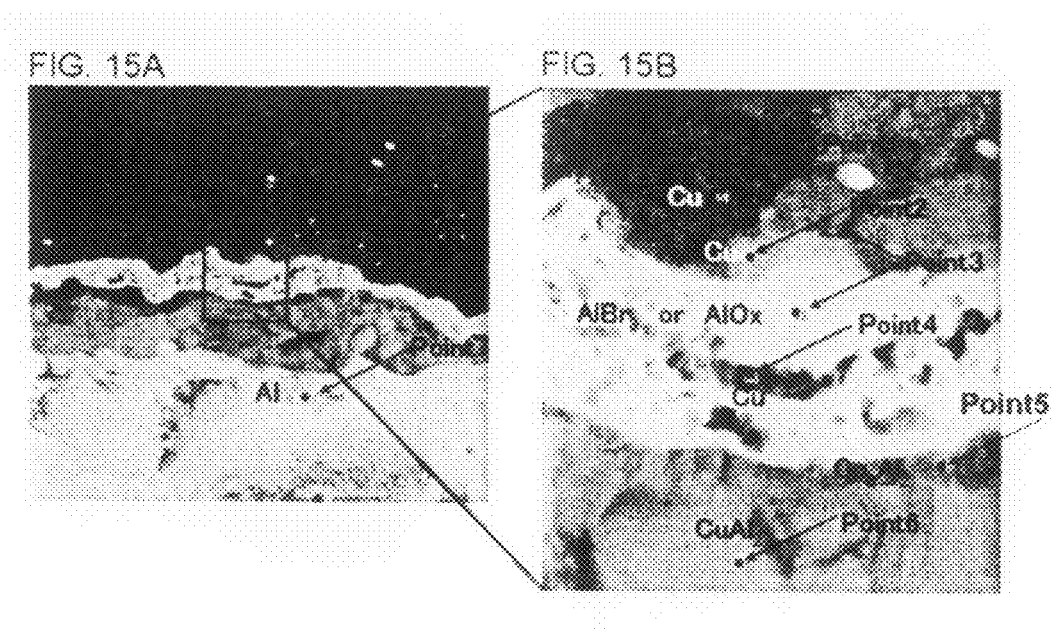
FIGS. 15A and 15B are cross-sectional views, showing junction structures between the electrode pad and the wire at higher temperature in Example.

As can be seen from FIG. 15 to FIG. 17, it was found that a Br-corrosion layer ($AlBr_3$ layer) was formed in the junction, when a resin containing Br was employed. In addition, Cu is pushed out from the alloy of Cu and Al to remain in the $AlBr_3$ layer.

Example 4

In the present example, an influence of the encapsulating resin material was evaluated. An electrode pad and a CuP wire, both having compositions that are the same as those employed in Example 1, were employed. The wire was joined to the electrode pad, and then was encapsulated with a Br-containing resin or a Br-free resin, and thereafter was kept at 175 degree C. for 700 hours.

Figure 18A:
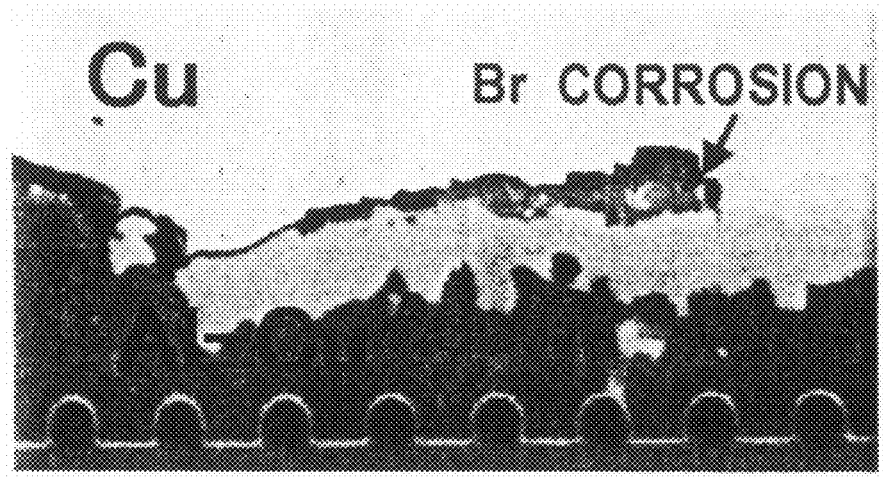
FIGS. 18A and 18B are cross-sectional views, showing junction structures between the electrode pad and the wire in Example.
Figure 18B:
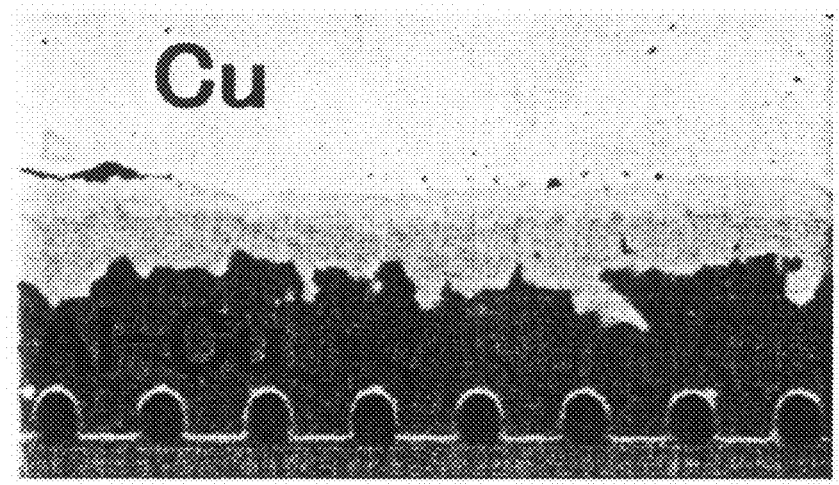

FIG. 18A is a cross-sectional view, showing the sample after the storage, which was encapsulated with a Br-containing resin, and FIG. 18B is a cross-sectional view, showing the sample after the storage, which was encapsulated with a Br-free resin.

As can be seen from FIG. 18A and FIG. 18B, it was found that no corrosion was caused in the sample encapsulated with the Br-free resin, while a corrosion was formed in a region of the junction in the sample encapsulated with the Br-containing resin.

According to the results of Examples 1 to 4, it is found that a plurality of alloy layers having different compositions are formed in the region of the junction between the Al pad containing Cu and the wire containing Cu, and then are encapsulated with the Br-free fire retardant resin, so that the initial alloy layer is homogeneously formed over the entire junction region and an excessive level of growth of the alloy layer and a corrosion with Br during the high-temperature storage are inhibited, thereby providing a considerably improved coupling reliability during an operation at higher temperature.

It is apparent that the present invention is not limited to the above embodiment, and may be modified and changed without departing from the scope and spirit of the invention.

What is claimed is:

1. A semiconductor device, comprising:
   a semiconductor chip;
   an electrode pad, provided in said semiconductor chip, and including aluminum (Al) as a major constituent and additionally including copper (Cu); and
   a coupling member, connecting a coupling terminal provided outside of the semiconductor chip with said semiconductor chip, and primarily including Cu,
   wherein a plurality of layers of Cu and Al alloys having different content ratio of Cu and Al are provided in a region for coupling said coupling member with said electrode pad,
   wherein said layers of Cu and Al alloys comprise a copper-aluminum alloy ($CuAl_2$) layer and a uniform concentration layer provided between said $CuAl_2$ layer and said coupling member having an Al content ratio that is relatively less than that of said $CuAl_2$ layer, said uniform concentration layer covering said $CuAl_2$ layer, and
   wherein said electrode pad and said coupling member are encapsulated with an encapsulating resin that includes substantially no halogen.

2. The semiconductor device as set forth in claim 1, wherein said uniform concentration layer provided between said $CuAl_2$ layer and said coupling member includes a copper-aluminum alloy (CuAl) layer having a content ratio of Cu and Al of 1:1, and
   wherein a layer is provided between said CuAl layer and said coupling member having an Al content ratio that is relatively lower than that of said CuAl layer.

3. The semiconductor device as set forth in claim 2, wherein a content ratio of Al over the whole said electrode pad is 50.0% wt, or higher and 99.9% wt, or lower, and a content ratio of Cu over the whole said electrode pad is 0.1% wt, or higher and 5.0% wt. or lower.

4. The semiconductor device as set forth in claim 3, wherein a resin in said encapsulating resin comprises a polymer compound having substantially no bromine (Br) group in molecular backbone.

5. The semiconductor device as set forth in claim 4, wherein said encapsulating resin includes a metal hydrate.

6. The semiconductor device as set forth in claim 3, wherein a thickness of said electrode pad in a region where said coupling member is coupled is equal to or greater than ¼ of a thickness of said electrode pad in a region where said coupling member is not coupled.

7. The semiconductor device as set forth in claim 2, wherein a resin in said encapsulating resin comprises a polymer compound having substantially no bromine (Br) group in molecular backbone.

8. The semiconductor device as set forth in claim 7, wherein said encapsulating resin includes a metal hydrate.

9. The semiconductor device as set forth in claim 2, wherein a thickness of said electrode pad in a region where said coupling member is coupled is equal to or larger than ¼ of a thickness of said electrode pad in a region where said coupling member is not coupled.

10. The semiconductor device as set forth in claim 1, wherein a content ratio of Al over the whole said electrode pad is 50.0% wt, or higher and 99.9% wt, or lower, and a content ratio of Cu over the whole said electrode pad is 0.1% wt, or higher and 5.0% wt. or lower.

11. The semiconductor device as set forth in claim 10, wherein a resin in said encapsulating resin comprises a polymer compound having substantially no bromine (Br) group in molecular backbone.

12. The semiconductor device as set forth in claim 11, wherein said encapsulating resin includes a metal hydrate.

13. The semiconductor device as set forth in claim 10, wherein a thickness of said electrode pad in a region where said coupling member is coupled is equal to or greater than ¼ of a thickness of said electrode pad in a region where said coupling member is not coupled.

14. The semiconductor device as set forth in claim 1, wherein said electrode pad further contains silicon (Si).

15. The semiconductor device as set forth in claim 1, wherein said coupling member further contains phosphorus (P).

16. The semiconductor device as set forth in claim 1, wherein a resin in said encapsulating resin comprises a polymer compound having substantially no bromine (Br) group in molecular backbone.

17. The semiconductor device as set forth in claim 16, wherein said encapsulating resin includes a metal hydrate.

18. The semiconductor device as set forth in claim 1, wherein said encapsulating resin comprises a metal hydrate.

19. The semiconductor device as set forth in claim 1, wherein a thickness of said electrode pad in a region where said coupling member is coupled is equal to or larger than ¼ of a thickness of said electrode pad in a region where said coupling member is not coupled.

20. The semiconductor device as set forth in claim 1, wherein said coupling member comprises a wire,
   wherein a ball is formed in a junction of said wire with said electrode pad, and
   wherein said ball is provided with a shoulder having an increased thickness of the ball from the center toward the outer periphery of the ball in cross-sectional view.

21. The semiconductor device as set forth in claim 1, wherein said uniform concentration layer covers an entirety of said $CuAl_2$ layer.

* * * * *